US009076945B2

(12) United States Patent
Herner (10) Patent No.: US 9,076,945 B2
(45) Date of Patent: *Jul. 7, 2015

(54) NANOWIRE LED STRUCTURE AND METHOD FOR MANUFACTURING THE SAME (71) Applicant: Glo AB, Lund (SE)

(72) Inventor: Scott Brad Herner, San Jose, CA (US)

(73) Assignee: GLO AB, Lund (SE)

( * ) Notice: Subject to any disclaimer, the term of this patent is extended or adjusted under 35 U.S.C. 154(b) by 0 days.

This patent is subject to a terminal disclaimer.

(21) Appl. No.: 14/059,629

(22) Filed: Oct. 22, 2013

(65) Prior Publication Data

US 2014/0117401 A1 May 1, 2014

Related U.S. Application Data (60) Provisional application No. 61/719,108, filed on Oct. 26, 2012.

(51) Int. Cl.
H01L 29/18 (2006.01)
H01L 33/00 (2010.01)
(Continued)

(52) U.S. Cl.
CPC ............... *H01L 33/62* (2013.01); *H01L 29/413* (2013.01); *H01L 29/0669* (2013.01);
(Continued)

(58) Field of Classification Search
CPC ................... H01L 21/02603; H01L 29/0665; H01L 29/0669; H01L 29/413; H01L 2221/1094; H01L 25/167; H01L 33/0004; H01L 33/0008; H01L 33/0012; H01L 33/36; H01L 33/62; H01L 2924/2041; H01L 2924/0002; H01L 2924/00; H01L 33/0095; H01L 33/24; H01L 33/38
USPC ............. 257/9, 13, 22, 79, 88, 414, 431, 443, 257/448, E51.001, 93, 99, E51.04
See application file for complete search history.

(56) References Cited

U.S. PATENT DOCUMENTS 7,335,908 B2 2/2008 Samuelson et al.
7,396,696 B2 7/2008 Kim et al.
(Continued)

FOREIGN PATENT DOCUMENTS

JP 2009147140 7/2009
KR 1020100080094 A 7/2010
(Continued)

OTHER PUBLICATIONS

U.S. Appl. No. 61/719,133 entitled "Nanowire Sized Opto-electronic Structure and Method for Modifying Selected Portions of Same," filed Oct. 26, 2012.
(Continued)

Primary Examiner — Teresa M Arroyo
(74) Attorney, Agent, or Firm — The Marbury Law Group PLLC (57) ABSTRACT A method for ablating a first area of a light emitting diode (LED) device which includes an array of nanowires on a support with a laser is provided. The laser ablation exposes a conductive layer of the support that is electrically connected to a first conductivity type semiconductor nanowire core in the nanowires, to form a first electrode for the LED device. In embodiments, the nanowires are aligned at least 20 degrees from the plane of the support. A light emitting diode (LED) structure includes a first electrode for contacting a first conductivity type nanowire core, and a second electrode for contacting a second conductivity type shell enclosing the nanowire core, where the first electrode and/or at least a portion of the second electrode are flat.

11 Claims, 7 Drawing Sheets (51) Int. Cl.
*H01L 27/146* (2006.01)
*H01L 33/62* (2010.01)
*H01L 33/38* (2010.01)
*H01L 29/41* (2006.01)
*H01L 29/06* (2006.01)
*H01L 33/36* (2010.01)
*H01L 21/02* (2006.01)
*H01L 33/24* (2010.01)

(52) U.S. Cl.
CPC .... *H01L 2221/1094* (2013.01); *H01L 29/0665* (2013.01); *H01L 33/36* (2013.01); *H01L 33/0004* (2013.01); *H01L 21/02063* (2013.01); *H01L 2924/12041* (2013.01); *H01L 33/0012* (2013.01); *H01L 33/0008* (2013.01); *H01L 33/0095* (2013.01); *H01L 33/24* (2013.01); *H01L 33/38* (2013.01); *H01L 2924/0002* (2013.01)

(56) References Cited

U.S. PATENT DOCUMENTS

| | | | |
|---|---|---|---|
| 7,829,443 | B2 | 11/2010 | Seifert et al. |
| 8,350,249 | B1 | 1/2013 | Svensson |
| 8,624,968 | B1* | 1/2014 | Hersee et al. ............. 348/80 |
| 2009/0065047 | A1* | 3/2009 | Fiorenza et al. ........... 136/255 |
| 2010/0283064 | A1 | 11/2010 | Samuelson |
| 2010/0327258 | A1* | 12/2010 | Lee et al. ................. 257/14 |
| 2011/0079766 | A1 | 4/2011 | Wildeson et al. |
| 2011/0163292 | A1 | 7/2011 | Wang et al. |
| 2011/0240959 | A1* | 10/2011 | Konsek et al. ............. 257/13 |
| 2011/0254034 | A1 | 10/2011 | Konsek et al. |
| 2011/0309382 | A1* | 12/2011 | Lowgren .................... 257/88 |
| 2012/0001153 | A1* | 1/2012 | Hersee et al. .............. 257/22 |
| 2012/0211727 | A1 | 8/2012 | Ohlsson et al. |
| 2013/0092900 | A1* | 4/2013 | Lowgren et al. ........... 257/13 |
| 2013/0221322 | A1 | 8/2013 | Ohlsson |
| 2014/0117307 | A1* | 5/2014 | Herner et al. .............. 257/13 |
| 2014/0141555 | A1* | 5/2014 | Lowgren .................... 438/29 |
| 2014/0284551 | A1* | 9/2014 | Herner et al. .............. 257/13 |

FOREIGN PATENT DOCUMENTS

| | | |
|---|---|---|
| KR | 1020110105641 A | 9/2011 |
| KR | 1020120092091 A | 8/2012 |
| WO | WO 2007/102781 A1 | 9/2007 |
| WO | WO2008/048704 A2 | 4/2008 |
| WO | WO 2010/014032 A1 | 2/2010 |
| WO | WO 2011/160051 | 12/2011 |
| WO | WO2012/050888 A2 | 4/2012 |
| WO | WO 2013/025874 | 2/2013 |

OTHER PUBLICATIONS

U.S. Appl. No. 14/059,950 entitled "Nanowire Sized Opto-electronic Structure and Method for Modifying Selected Portions of Same," filed Oct. 22, 2013.

U.S. Appl. No. 61/718,884, entitled "Nanowire Sized Opto-electronic Structure and Method for Modifying Selected Portions of Same," filed Oct. 26, 2012.

U.S. Appl. No. 14/059,658, entitled "Nanowire Sized Opto-electronic Structure and Method for Modifying Selected Portions of Same," filed Oct. 22, 2013.

International Search Report and Written Opinion received in connection with international application No. PCT/US2013/066165; mailed Feb. 14, 2014.

International Search Report and Written Opinion received in connection with international application No. PCT/US2013/066151; mailed Feb. 17, 2014.

Binari et al., "H, He, and N implant isolation of n-type GaN", J. Appl. Phys. 78, 3008 (1995).

Pearton et al., "Thermal stability of $^2$H-implanted $n$- and $p$-type GaN", Appl. Phys. Lett., 73, 1877 (1998).

Pearton et. al., "Reactivation of acceptors and trapping of hydrogen in GaN/InGaN double heterostructures", Appl. Phys. Lett., 69, 1879 (1996).

International Search Report and Written Opinion received in connection with international application No. PCT/US2013/066129; mailed Mar. 20, 2014.

* cited by examiner

*SEM image of metal pad on top of ITO – area flattened by ablation prior to ITO and metal deposition*

A. Metal pad on top of nanowire-free zone
Laser Ablation Process

B. Metal pad on top of nanowires
No Laser Ablation

Area ablated of nanowires (501)

FIG. 6

NANOWIRE LED STRUCTURE AND METHOD FOR MANUFACTURING THE SAME

RELATED APPLICATION

This application claims the benefit of priority to U.S. Provisional Application Ser. No. 61/719,108, filed Oct. 26, 2012, the entire contents of which are incorporated herein by reference.

FIELD

The present invention is directed to nanostructured devices, such as nanowire light emitting diodes (LEDs), and methods for manufacturing such devices.

BACKGROUND OF THE INVENTION

Nanowire light emitting diodes (LED) are of increasing interest as an alternative to planar LEDs. In comparison with LEDs produced with conventional planar technology, nanowire LEDs offer unique properties due to the one-dimensional nature of the nanowires, improved flexibility in materials combinations due to less lattice matching restrictions and opportunities for processing on larger substrates.

Contacting of the nanowire LEDs requires new routes — compared to planar technology. Since nanowire LEDs comprise large arrays of nanowires, thereby forming a three-dimensional surface with high aspect ratio structures, deposition of contact material using line-of-sight processes is a challenging operation, and alternative methods of forming contacts would be useful.

SUMMARY OF THE INVENTION

In one aspect, the invention is a method for ablating a first area of an light emitting diode (LED) device with a laser, the LED device comprising an array of nanowires on a support, wherein the laser ablation exposes a conductive layer of the support that is electrically connected to a first conductivity type semiconductor nanowire core in the nanowires, to form a first electrode for the LED device. In embodiments, the nanowires are aligned at least 20 degrees from the plane of the support.

Another aspect of the invention is a light emitting diode (LED) structure comprising (i) a plurality of devices on a support layer that comprises a substrate, a buffer layer, and a dielectric mask layer, wherein the devices comprise a first conductivity type semiconductor nanowire core that is in electrical contact with the buffer layer and an enclosing second conductivity type semiconductor shell, wherein the core and the shell are configured to form a pn or pin junction that in operation provides an active region for light generation and the shell is insulated from the buffer layer by the mask layer, (ii) a first electrode for contacting the first conductivity type core and (iii) a second electrode for contacting the second conductivity type shell, wherein the first electrode and/or at least a portion of the second electrode are flat.

DETAILED DESCRIPTION OF THE INVENTION

The invention provides methods for laser ablation of selected areas of nanowire light emitting diodes (LEDs) to remove predetermined materials in parts of the LED structure to provide a surface for an electrode. The invention also provides compositions that can be fabricated, e.g., using the methods of the invention.

LEDs made from nanowires emerging from a planar surface can present challenges in fabricating contacts to the nanowires. With methods such as etching, e.g., etching the LED to reach a conductive layer such as a buffer layer, as described more fully herein, one must remove the nanowires and an insulating mask layer to expose the conductive buffer layer underneath. Dry etch of the nanowires may result in much of the topography translating into the buffer layer beneath. This rough topography can make it more difficult to make a low resistance metal contact, and may increase the thickness of conductive buffer layer, e.g., n-type GaN, needed to insure there is conductive buffer film, e.g. GaN, in all areas. An increased buffer layer not only increases costs, but also "bows" or deforms the wafer more due to the mismatch in coefficient of thermal expansion (cte) between GaN and the sapphire substrate. It can also be difficult to wire bond to a metal surface that has a rough topography. A feasible wet etch that can be used with standard photoresist patterning does not exist for, e.g., GaN.

Laser ablation of the nanowires and/or of support layers is an alternative provided by the methods and compositions of the invention. Ablation involves using a laser, e.g., a pulsed laser, shot onto the wafer to selectively ablate the nanowires and/or support layers away in a controlled manner, so that desired layers beneath the nanowires may be maintained, e.g., a conductive buffer layer such as a GaN layer. The spot size of a laser pulse can be focused to a diameter between 1 to 200 microns. Spot size can be, e.g., 30 microns, to define larger contact areas, e.g., a 70 micron diameter n-type contact area by contiguous or overlapping irradiated areas on the wafer. While most laser ablation debris is removed during the ablation process by simple vacuum, any remaining debris can be removed with a simple spin-rinse-dry (SRD). With laser ablation, photoresist is not used to define the pattern, but rather, simple beam steering. As ablation involves only a laser tool and possibly only a solvent removal of debris (2 tools total), it is less expensive and less complicated than dry etching, which involves depositing photoresist, exposing the photoresist, developing the photoresist, dry etching, ashing of the photoresist, and solvent removal of the photoresist (at least 5 tools).

Laser ablation can also be used to fully remove nanowires, dielectric masking layers, and/or buffer layers, to expose lower layers, such as a non-conductive substrate layer. This provides a method for isolating parts of a device. For example, complete ablation of material down to substrate prior to deposition of a conductive material can provide a flat surface for depositing a conductor and subsequently making a contact to outside the die. A flat surface is a surface where, for example, there is less than 1000 nm variation from the overall plane of the surface per 1 square microns of planar surface. For example, in a nanowire LED that includes nanowires arrayed on a support that includes a $Si_3N_4$ masking layer, a GaN buffer layer, and an $Al_2O_3$ substrate layer, laser ablation can be used to completely or substantially completely ablate all layers down to the $Al_2O_3$ substrate layer and provide a flat surface for deposition of other layers, for example, a conductive layer such as Indium Tin Oxide (ITO).

In the art of nanotechnology, nanowires are usually interpreted as nanostructures having a lateral size (e.g., diameter for cylindrical nanowires or width for pyramidal or hexagonal nanowires) of nano-scale or nanometer dimensions, whereas its longitudinal size is unconstrained. Such nanostructures are commonly also referred to as nanowhiskers, one-dimensional nano-elements, nanorods, nanotubes, etc. Generally, nanowires with a polygonal cross section are considered to have at least two dimensions each of which are not greater than 300 nm. However, the nanowires can have a diameter or width of up to about 1 micron. The one dimensional nature of the nanowires provides unique physical, optical and electronic properties. These properties can for example be used to form devices utilizing quantum mechanical effects (e.g., using quantum wires) or to form heterostructures of compositionally different materials that usually cannot be combined due to large lattice mismatch. As the term nanowire implies, the one dimensional nature is often associated with an elongated shape. In other words, "one dimensional" refers to a width or diameter less than 2 micron and a length greater than 1 micron. Since nanowires may have various cross-sectional shapes, the diameter is intended to refer to the effective diameter. By effective diameter, it is meant the average of the major and minor axis of the cross-section of the structure.

All references to upper, top, lower, downwards etc. are made as considering the substrate being at the bottom and the nanowires extending upwards from the substrate. Vertical refers to a direction parallel to the longer extension of the nanowire, and horizontal to a direction parallel to the plane formed by the substrate. This nomenclature is introduced for the easy of understanding only, and should not be considered as limiting to specific assembly orientation etc.

In the methods of the invention, laser ablation is used in one or more steps of the methods to remove nanowires and/or other structures from a LED structure to provide a surface, preferably a flat surface, to construct an electrode, most especially where there is another contact from this electrode to outside the die; in some embodiments the surface itself may serve as an electrode. The surface may be a conductive material, e.g., a buffer layer as described more fully herein, or it may serve as a platform for the placement of a conductive material, e.g., a conductive layer. The conductive materials serve as electrodes that provide an electrical contact to one or more conductive areas of the nanowires, providing a structure for completion of the circuit between parts of the nanowire, e.g., between a p-type semiconductor and an n-type semiconductor.

Any suitable nanowire LED structure as known in the art may be used in the methods of the invention.

Nanowire LEDs are typically based on one or more pn- or p-i-n-junctions. The difference between a pn junction and a p-i-n-junction is that the latter has a wider active region. The wider active region allows for a higher probability of recombination in the i-region. Each nanowire comprises a first conductivity type (e.g., n-type) nanowire core and an enclosing second conductivity type (e.g., p-type) shell for forming a pn or pin junction that in operation provides an active region for light generation. While the first conductivity type of the core is described herein as an n-type semiconductor core and the second conductivity type shell is described herein as a p-type semiconductor shell, it should be understood that their conductivity types may be reversed.

Figure 1:
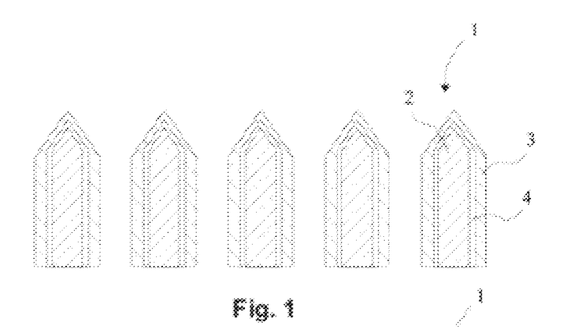
FIG. 1 schematically illustrates a side cross sectional view of a basis of a nanowire LED in accordance with embodiments of the invention, FIG. 2 schematically illustrates a side cross sectional view of a nanowire LED structure on a buffer layer in accordance with embodiments of the invention, FIGS. 3A-G schematically illustrate side cross sectional views of a method of constructing contact electrodes for a nanowire LED in accordance with embodiments of the invention.

FIG. 1 schematically illustrates the basis for a nanowire LED structure that is modified in accordance with embodiments of the invention. In principle, one single nanowire is enough for forming a nanowire LED, but due to the small size, nanowires are preferably arranged in arrays comprising hundreds, thousands, tens of thousands, or more, of nanowires side by side to form the LED structure. For illustrative purposes the individual nanowire LED devices will be described herein as being made up from nanowires 1 having an n-type nanowire core 2 and a p-type shell 3 at least partly enclosing the nanowire core 2 and an intermediate active layer 4. However, for the purpose of embodiments of the invention nanowire LEDs are not limited to this. For example the nanowire core 2, the active layer 4 and the p-type shell 3 may be made up from a multitude of layers or segments. In alternative embodiments, only the core 2 may comprise a nanostructure or nanowire by having a width or diameter below 2 micron, while the shell 3 may have a width or diameter above one micron.

For nanowire fabrication, the III-V semiconductors are of particular interest due to their properties facilitating high speed and low power electronics. The nanowires can comprise any semiconductor material, and suitable materials for the nanowire include but are not limited to: GaAs (p), InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc, and acceptor dopants for the same material are Zn, Fe, Mg, Be, Cd, etc. It should be noted that the nanowire technology makes it possible to use nitrides such as GaN, InN and AlN, which facilitates fabrication of LEDs emitting light in wavelength regions not easily accessible by conventional technique. Other combinations of particular commercial interest include, but are not limited to GaAs, GaInP, GaAlInP, GaP systems. Typical doping levels range from $10^{18}$ to $10^{20}$. A person skilled in the art is though familiar with these and other materials and realizes that other materials and material combinations are possible.

Preferred materials for nanowire LEDs are III-V semiconductors such as a III-nitride semiconductor (e.g., GaN, AlInGaN, AlGaN and InGaN, etc.) or other semiconductors (e.g., InP, GaAs). In order to function as a LED, the n-side and p-side of each nanowire 1 has to be contacted, and the present invention provides methods and compositions related to contacting the n-side and the p-side of the nanowires in a LED structure.

Although the exemplary fabrication method described herein preferably utilizes a nanowire core to grow semiconductor shell layers on the cores to form a core-shell nanowire, as described for example in U.S. Pat. No. 7,829,443, to Seifert et al., incorporated herein by reference for the teaching of nanowire fabrication methods, it should be noted that the invention is not so limited. For example, in alternative embodiments, only the core may constitute the nanostructure (e.g., nanowire) while the shell may optionally have dimensions which are larger than typical nanowire shells. Furthermore, the device can be shaped to include many facets, and the area ratio between different types of facets may be controlled. This is exemplified in figures by the "pyramid" facets and the vertical sidewall facets. The LEDs can be fabricated so that the emission layer formed on templates with dominant pyramid facets or sidewall facets. The same is true for the contact layer, independent of the shape of the emission layer.

Figure 2:
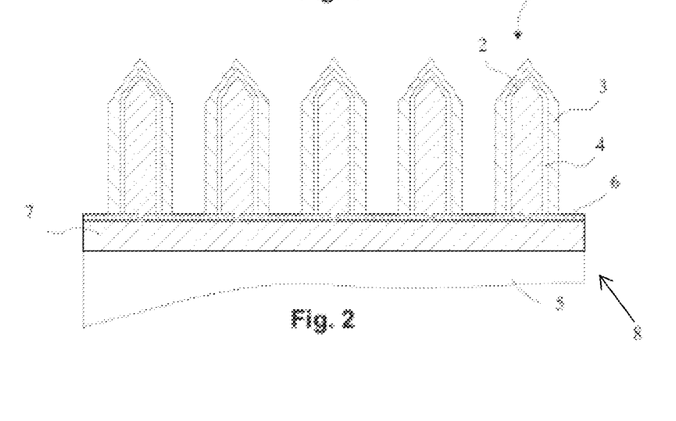

FIG. 2 illustrates an exemplary structure that provides a support for the nanowires. By growing the nanowires 1 on a growth substrate 5, optionally using a growth mask, or dielectric masking layer 6 (e.g., a nitride layer, such as silicon nitride dielectric masking layer) to define the position and determine the bottom interface area of the nanowires 1, the substrate 5 functions as a carrier for the nanowires 1 that protrude from the substrate 5, at least during processing. The bottom interface area of the nanowires comprises the area of the core 2 inside each opening in the dielectric masking layer 6. The substrate 5 may comprise different materials such as III-V or II-VI semiconductors, Si, Ge, $Al_2O_3$, SiC, Quartz, glass, etc., as discussed in Swedish patent application SE 1050700-2 (assigned to GLO AB), which is incorporated by reference herein in its entirety. Other suitable materials for the substrate include, but are not limited to: GaAs, GaP, GaP:Zn, GaAs, InAs, InP, GaN, GaSb, ZnO, InSb, SOI (silicon-on-insulator), CdS, ZnSe, CdTe. In one embodiment, the nanowires 1 are grown directly on the growth substrate 5.

Preferably, the substrate 5 is also adapted to function as a current transport layer connecting to the n-side of each nanowire 1. This can be accomplished by having a substrate 5 that comprises a buffer layer 7 arranged on the surface of the substrate 5 facing the nanowires 1, as shown in FIG. 2, by way of example a III-nitride layer, such as a GaN and/or AlGaN buffer layer 7 on a Si substrate 5. The buffer layer 7 is usually matched to the desired nanowire material, and thus functions as a growth template in the fabrication process. For an n-type core 2, the buffer layer 7 is preferably also doped n-type. The buffer layer 7 may comprise a single layer (e.g., GaN), several sublayers (e.g., GaN and AlGaN) or a graded layer which is graded from high Al content AlGaN to a lower Al content AlGaN or GaN. The growth of nanowires can be achieved by utilizing methods described in the U.S. Pat. Nos. 7,396,696, 7,335,908, and 7,829,443, and WO201014032, WO2008048704 and WO 2007102781, all of which are incorporated by reference in their entirety herein.

It should be noted that the nanowire 1 may comprise several different materials (e.g., GaN core, InGaN active layer and InGaN shell having a different In to Ga ratio than the active layer). In general the substrate 5 and/or the buffer layer 7 are referred to herein as a support or a support layer for the nanowires. In certain embodiments, a conductive layer (e.g., a mirror or transparent contact) may be used as a support instead of or in addition to the substrate 5 and/or the buffer layer 7. Thus, the term "support layer" or "support" may include any one or more of these elements.

The use of sequential (e.g., shell) layers gives that the final individual device (e.g., a pn or pin device) may have a shape anywhere between a pyramid or tapered shape (i.e., narrower at the top or tip and wider at the base) and pillar shaped (e.g., about the same width at the tip and base) with circular or hexagonal or other polygonal cross section perpendicular to the long axis of the device. Thus, the individual devices with the completed shells may have various sizes. For example, the sizes may vary, with base widths ranging from 100 nm to several (e.g., 5) μm, such as 100 nm to below 2 micron, and heights ranging from a few 100 nm to several (e.g., 10) μm.

The buffer layer 7 provides a structure for contacting the n-side of the nanowires 1.

The above description of an exemplary embodiment of a LED structure will serve as a basis for the description of the methods and compositions of the invention; however, it will be appreciated that any suitable nanowire LED structure or other suitable nanowire structure may also be used in the methods and compositions, with any necessary modifications as will be apparent to one of skill in the art, without departing from the invention.

In certain embodiments, the invention provides a method of providing electrical contact to a conductivity type semiconductor of an LED that is accomplished using selective removal of layers of the LED by laser ablation.

In one embodiment, the invention provides a method comprising laser ablating a first area of an light emitting diode (LED) device comprising an array of nanowires on a support, where the laser ablation exposes a conductive layer of the support that is electrically connected to a first conductivity type semiconductor nanowire core in the nanowires, to form a first electrode for the LED device. Laser ablation allows the formation of a flat surface for the electrode, e.g., in certain embodiments an electrode surface with a flatness of at least <100 nm of z height within an area of 1 micron by 1 micron. The method may further comprise forming a second electrode for the LED device. The second electrode may be constructed by any suitable means. In certain embodiments, the second electrode is electrically connected to a second conductivity type semiconductor nanowire shell in the nanowires. The nanowire shell may comprise, e.g., a p-type conductivity semiconductor and the nanowire core may comprise, e.g., an n-type conductivity semiconductor, which together form a pn or pin junction that in operation provides an active region for light generation.

The first electrode may comprise a metal or TCO film contacting a buffer layer, such as a buffer layer comprising gallium nitride or aluminum gallium nitride, from which the nanowire core was grown during production of the array of nanowires, as described further herein. The support can further comprise a dielectric masking layer, such that cores protrude from the buffer layer through openings in the masking layer, and the shells are located on the masking layer.

The second electrode may comprise an ITO layer that is electrically connected to the p-type nanowire shells, such as a transparent conductive oxide layer, e.g., Indium Tin Oxide (ITO). The second electrode may be formed by any suitable method. In certain embodiments, the second electrode is formed by laser ablating a second area in the LED device to expose the substrate layer of the support, depositing an insulating material on the LED device by angled deposition such that the second area of the LED device is substantially completely covered by the insulating material and areas between the nanowires are free of the insulating material so that the shells of the nanowires are exposed, but where the laser ablated flat areas are covered by the insulating film; and depositing a conductive material over the LED device, so that the conductive material contacts the exposed nanowire shells to form a second electrode in contact with the nanowire shells. This may also be accomplished by angled implant of a species such as hydrogen that renders the outer layer of the implanted GaN insulating. In these embodiments, the method may further comprise removing conductive material and insulating material in the first area to re-expose the conductive material and re-form the first electrode.

In one embodiment, the nanowires and masking layer are removed to expose the n-GaN buffer layer. Laser ablation in one embodiment involves using a pulsed laser directed onto the wafer to selectively ablate nanowires and other structures in a controlled manner exposing the desired layers beneath the nanowires, e.g., the conductive buffer layer such as n-doped GaN layer. The spot size of a laser pulse can be focused to a circle with diameter of 10-200 microns, such as 30 microns. Smaller spot sizes are sufficiently small, e.g., 30 microns, to define larger contact areas, e.g., a 70 micron n-type area by doing multiple shots where the shots land contiguously with one another, or overlap, and thus buildup a larger ablated zone than the original size of an individual laser pulse. Debris from laser ablation can be removed with low pressure vacuum simultaneous with the ablation or with a simple spin-rinse-dry (SRD) after ablation. With laser ablation, photoresist is not used to define the pattern, but rather, simple beam steering. Laser ablation can also be used to fully remove nanowires, dielectric masking layers, and/or buffer layers, to expose lower layers, such as a non-conductive substrate layer. This provides a method for isolating parts of a device. For example, complete ablation of material down to substrate prior to deposition of a conductive material can provide a flat surface, which makes for a superior mechanical strength bond surface with no chance for shorting to other parts of the die. For example, in a nanowire LED that includes nanowires arrayed on a support that includes a Si3N4 masking layer, a GaN buffer layer, and an Al2O3 substrate layer, laser ablation can be used to completely or substantially completely ablate all layers down to the Al2O3 substrate layer and provide a flat surface for deposition of other layers, for example, a conductive layer such as Indium Tin Oxide (ITO). Or one or more these layers may be selectively ablated, with the unablated layers remaining.

Any suitable laser may be used in the methods of the invention. An exemplary laser is a Coherent Talisker Laser, which is a modular fiber laser with regenerative amplifier platform, capable of picosecond pulses. In certain embodiments, the laser ablation is performed using a pulsed laser. The spot size may be between 1 and 150 microns in diameter, such as between 30 and 140 microns, for example between 30 and 130 microns. However, any spot size that is compatible with the laser used and the intended result in terms of ablation of LED structure and formation of an electrode may be used. The energy of each pulse may be between 0.05 and 0.100 J/cm$^2$, such as between 0.10 and 0.80 J/cm$^2$, for example, between 0.13 and 0.71 J/cm$^2$. A single laser pulse maybe sufficient to remove the desired layers or multiple pulses on the same area may be required. When defining an area to be ablated, the pulse shots may overlap, be contiguous, or have space between each shot.

The laser tool delivers a pulse of light in the lateral shape of a circle, although other shapes are possible. By using mirrors, the next pulse of light can be placed in a different location. The location of the $2^{nd}$ pulse may or may not overlap with the location of the $1^{st}$ pulse. Lasers of wavelengths 355, 532, and 1024 nm are preferred. The frequency of the laser is between about 10 and about 1000 kHz, preferably about 200 kHz. The pulse of energy (J/cm$^2$), the spacing or lack thereof, of between pulses, and the wavelength of light are chosen based on the materials that are being ablated and the depth of ablation desired. It is desirable for the surface material being ablated to absorb the light energy, and the absorption depends on the material and wavelength. The spot of the pulse can also be varied depending on the required energy (J/cm$^2$) and feature size being ablated. In general, the spot size should be similar or smaller than the feature size being ablated. As in displays, a smaller spot size will allow resolution of finer features. But a small spot size will also require more time to "write" a feature. If a particular material does not absorb strongly or if layer needs to be ablated to a larger depth, multiple passes or loops of the laser pulse may be required. This occurs when a pulse is applied to the same area multiple times.

In an exemplary embodiment shown in FIGS. 3A-G, the following steps are performed on an LED structure 8 that includes a plurality of nanowires 1, such as tapered nanowires that are arranged on a support, where the nanowires comprise a first conductivity type semiconductor core 2 and a second conductivity type shell 3 that are configured to form a pn or pin junction that in operation provides an active region for light generation (intermediate active layer, 4 in FIG. 1 and FIG. 2, not shown FIG. 3). The solid support includes a bottom substrate layer 5, a buffer layer 7 that is in electrical contact with the nanowire core 2, and a dielectric masking layer 6 that insulates the nanowire shell 3 from the buffer layer. See FIG. 3A.

In one embodiment, for nanowires with straight sidewalls, the TCO deposition is performed by CVD, sputtering, or angled deposition, or combinations thereof.

Figure 3A:
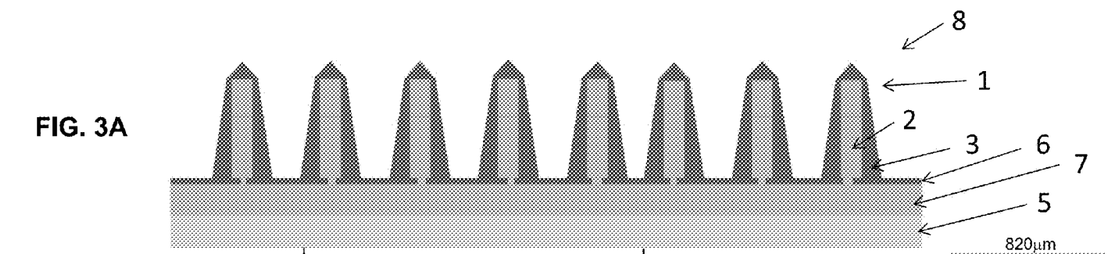
Figure 3B:
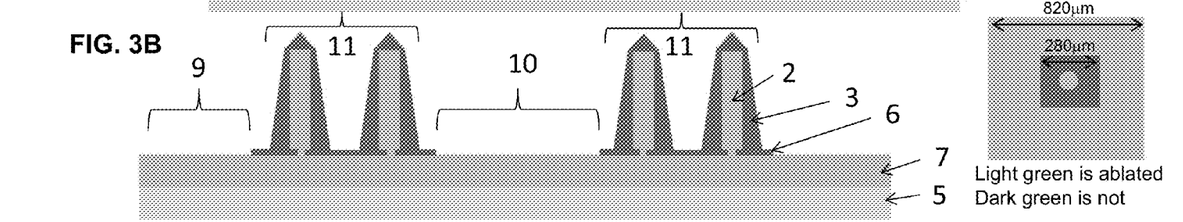
Figure 3C:
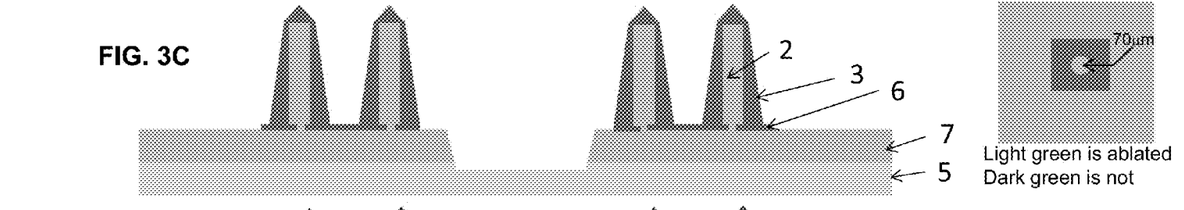
Figure 3D:
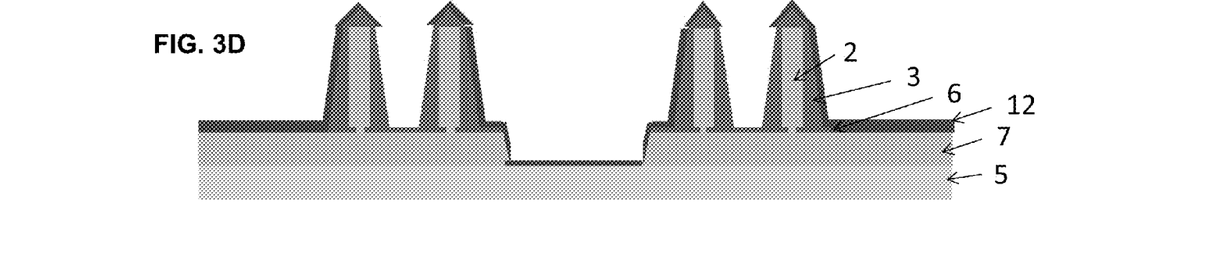
Figure 3E:
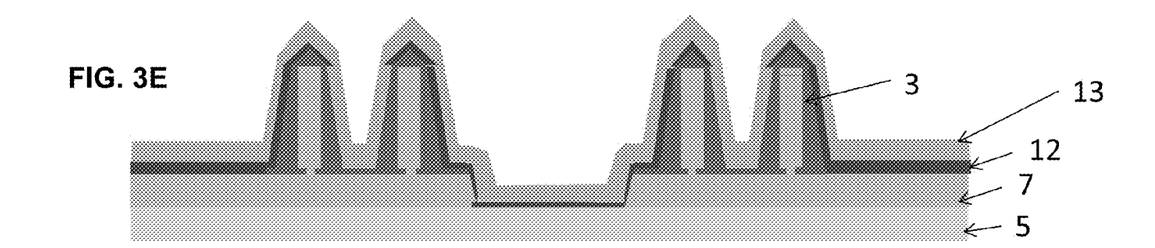

As shown in FIG. 3B, laser ablation is performed in a perimeter (e.g., peripheral) area 9 and a central (e.g., active light emitting) area 10 to ablate nanowires and the dielectric masking layer, leaving the buffer layer 7 exposed in the central and peripheral areas and a ring of intact nanowires 11 between the central and peripheral areas. Exemplary dimensions can be, e.g., 820 microns for the sides of the peripheral region and 280 microns for the sides of the central area inside the peripheral area, but any suitable dimensions may be used to achieve an intended electrode. FIG. 3C shows further laser ablation in the central area 10 (but not in the peripheral area 9) removes the buffer layer 7 and exposes the substrate layer 5. An exemplary dimension of the area that is further ablated may be, e.g., a circle 70 microns in diameter, but any suitable dimensions may be used to achieve an intended electrode. As shown in FIG. 3D, an insulating material 12, such as Al$_2$O$_3$, is deposited by angled deposition, e.g., by rotation to deposit on all sides, such that the area between the nanowires is not subject to deposit because it is in shadow from the angles of deposit from the first side and from the second side, but the rest of the structure, including the buffer layer 7 of the peripheral region and the substrate layer 5 of the central region, are covered with a layer of the insulator 12. Any suitable insulating material that can be deposited by an angled deposit may be used. The angled deposition may be achieved by methods well-known in the art, such as evaporation or sputtering. Further details on angled depositions are provided in co-pending U.S. Provisional application No. 61/718,884, entitled "Nanowire Sized Opto-electronic Structure and Method for Modifying selected Portions of Same, filed on Oct. 26, 2012, which is incorporated herein by reference in its entirety. p FIG. 3E shows a high electrical conductivity layer13 that serves as an electrode is then deposited evenly over the entire structure, for example a layer of ITO deposited by any suitable means, such as by evaporation or CVD. It will be appreciated that the use of ITO provides for a high transmission top layer and thus is useful in the construction of a top-emitting LED structure. If a top-emitting LED structure is desired, any other suitable high electrical conductivity, high transmission material may be used for the high electrical conductivity layer. In the case of a transparent top contact layer, Indium Tin Oxide (ITO), or other transparent compounds or highly doped semiconductors having high electrical conductivity and transmittance may be used. The high electrical conductivity layer 13 is in contact with the outer shell 3 of the nanowires but is insulated from the inner core 2, providing an electrode (e.g., a second electrode) for connection with the second conductivity type shell. As shown in FIG.

Figure 3F:
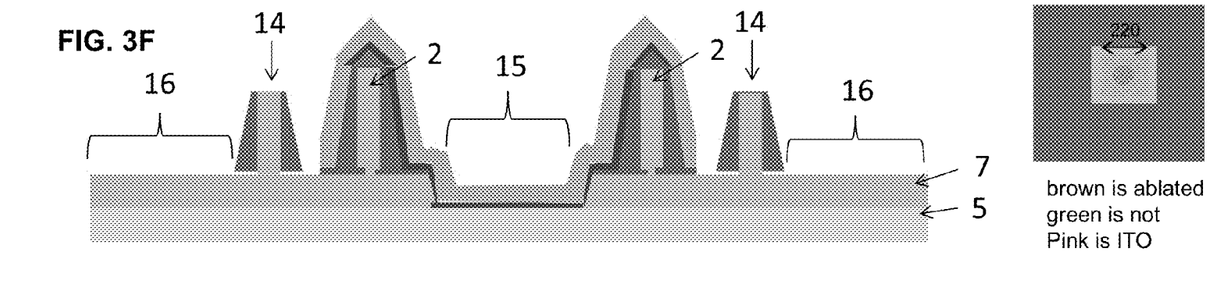

3F, the structure is then subjected to another ablation step, so that the nanowires 14 in the outer portion of the ring of nanowires are ablated e.g., to remove layers 13 and 12 from nanowires 14 and area 9, to expose the first conductivity type core 2 and the peripheral area 9 is ablated down to the buffer layer 7 in electrical connection with the first conductivity type cores 2 of the nanowires, which buffer layer can serve as another electrode (e.g., a first electrode) for connection of the first conductivity type cores of the nanowires, without the necessity for deposition of a conductive substance.

The result of these steps is a LED with a flat contact area 15 in the central area in electrical contact with the second conductivity type semiconductor (e.g., via layer 13 contacting the p-type shell 3 regions exposed by layer 12), and a flat contact area 16 in the peripheral area in electrical contact with the first conductivity type semiconductor.

Figure 3G:
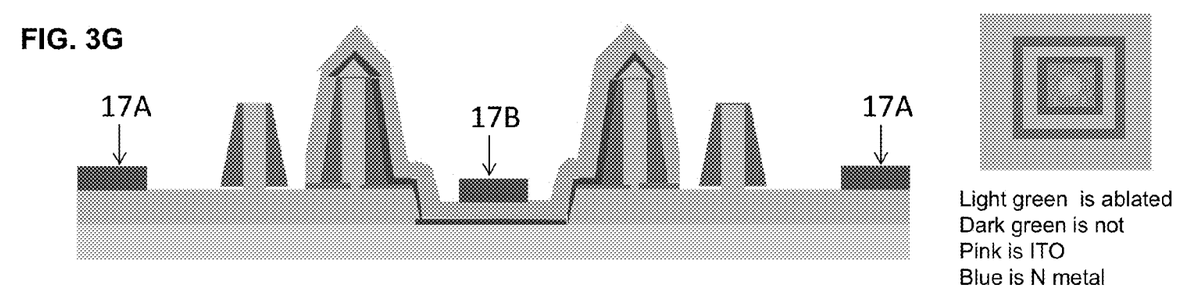

As shown in FIG. 3G, conductive pads, such as a metal contact pads 17A, 17B, e.g. an Al pad, may be laid down on the first electrode and on the second electrode by use of a PR pattern, metal deposition such as Al deposition, and lift off. Suitable materials for use in metal contacts on semiconductors are Al, Ag, Cu, Ti, Au or Pd.

Additional suitable materials include, but are not limited to, Ni, TiN, Ta, Pt, TaN, Co, Mn, Cr, W, and Mo. However, alloys of the metals mentioned may also be used or combinations of them in varying stacks may also be used. The properties of the metals and metal alloys are high electrical conductivity and compatibility with the total material system. Also non-metallic contact materials may be used, such as highly doped semiconductor materials. The properties of the metals and metal alloys are high electrical conductivity and compatibility with the total material system.

In a preferred embodiment, the metal contact to both n and p layers is the same in order to save a masking step. A preferred metal contact is a stack of Al/Ti/Au. In another embodiment, Al/Ti/Au is used for n contact 17A and Ti/Au for p contact 17B.

Figure 4:
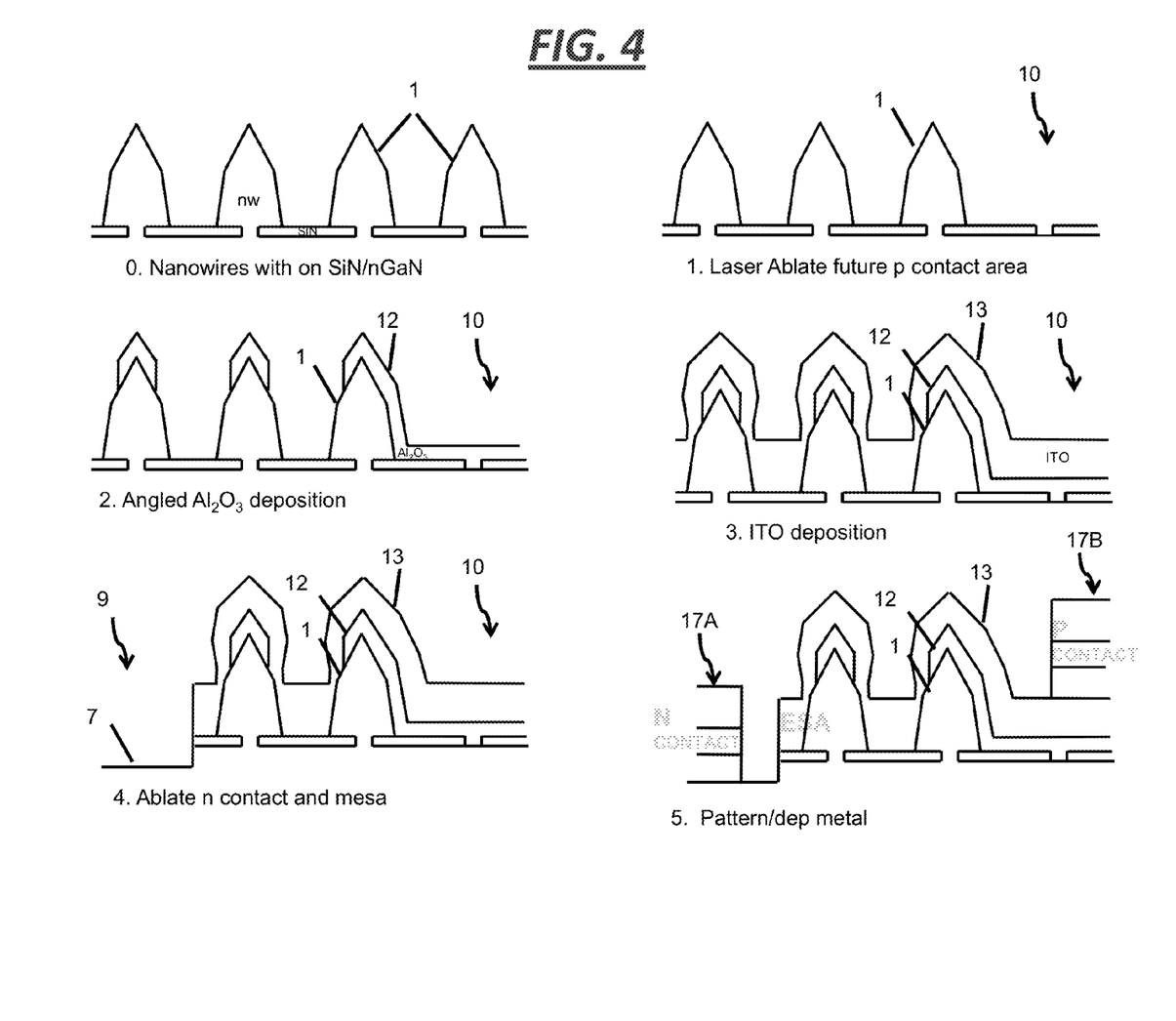
FIG. 4 is a schematic depiction of an embodiment of the methods of the invention.

FIG. 4 depicts another embodiment of the invention. The method of this embodiment comprises removal of a group of nanowires 1 by laser ablation to make a p-side contact area 10 (FIG. 4, step 1), followed by angled deposition of an insulating material 12 (e.g., $Al_2O_3$) over the p-side contact area 10 and tops of nanowires 1 but not between the nanowires 1 (step 2). Then, ITO or another p-side electrode material 13 is formed over the entire device (including between the nanowires 1) in step 3. Then, the n-side contact area 9 is formed by ablating the ITO layer 13, the nanowires 1 and insulating material 12, and the masking layer 6 to expose the n-type buffer layer 7 (step 4). N-side 17B and P-side 17A contacts are then formed by lift off or metal deposition and patterning by photolithography, on respective n-side 9 and p-side contact areas 10, similar to that shown in FIG. 3G. Wire bonds are then mechanically fastened to these contacts. The wire bonding process involves pressing a gold ball with wire to the metal contact. This pressing is with great force that tends to crush and deform nanowires, hence, it is preferred to remove them and press against a flat surface.

Figure 5:
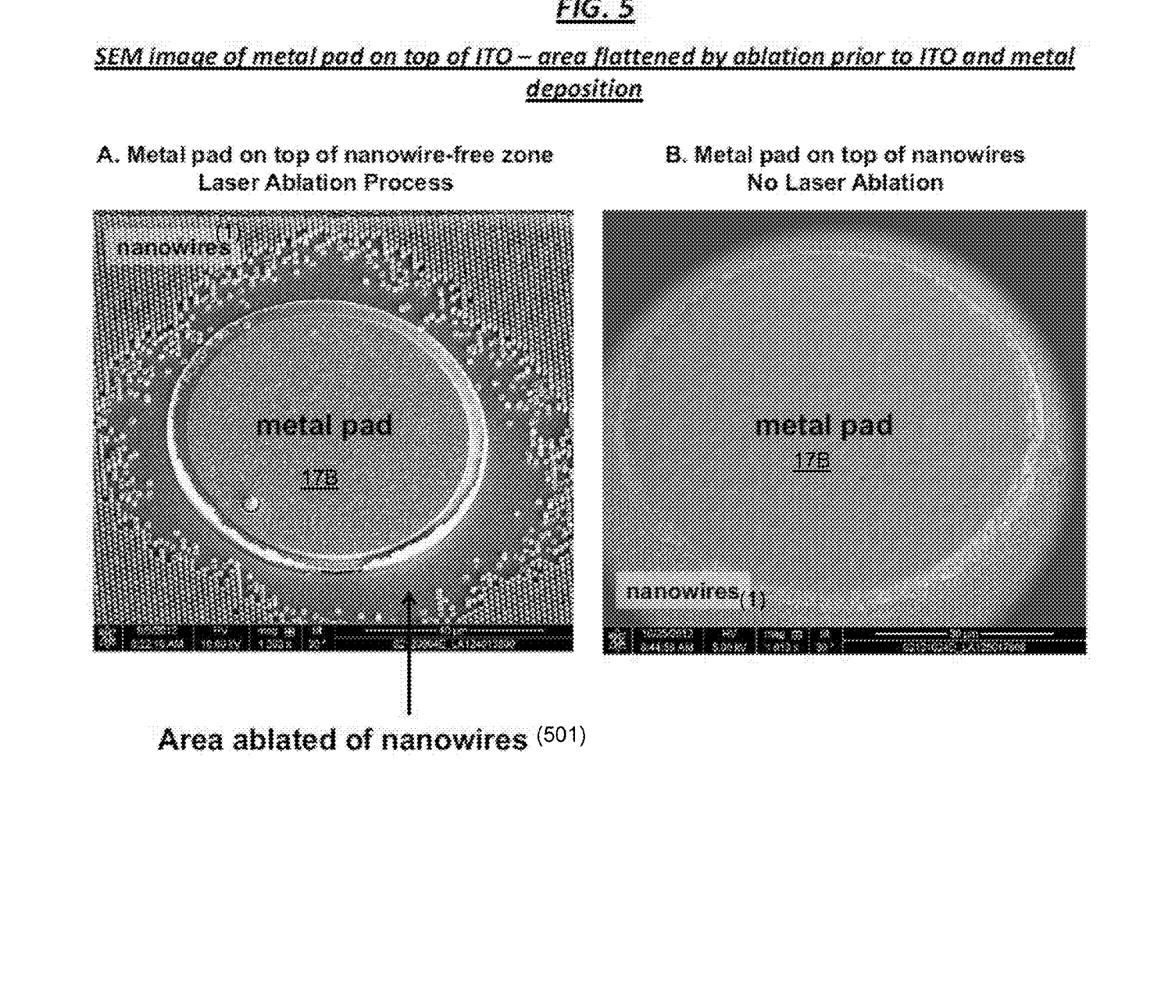
FIG. 5 is an SEM image of nanowires.

FIG. 5 is an SEM image of a metal pad 17B on top of an ITO layer in a nanowire 1 device. FIG. 5A illustrates a device produced using a laser ablation process such that the metal pad 17B is formed on an area 501 in which the nanowires 1 are removed during the laser ablation step. In FIG. 5B, the metal pad 17B is formed on top of the nanowires 1 with no laser ablation.

Figure 6:
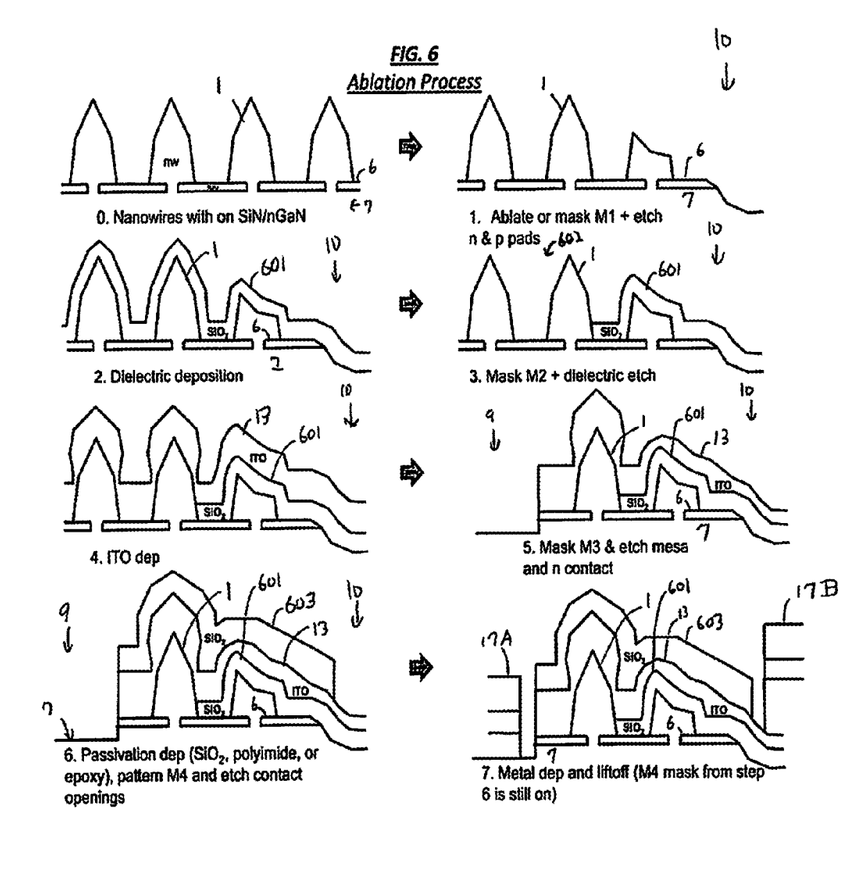
FIG. 6 is a schematic depiction of an embodiment of the methods of the invention.

FIG. 6 and FIGS. 7A-D depict two more embodiments of the invention, in particular they depict methods which may include a laser ablation process. As shown in FIG. 6, the nanowires 1 are removed from the future p contact area 10 by either laser ablation or by mask and etch (step 1). This prevents an n-to-p short forming in future steps, and planarizes the area 10 for future wire bonding. Next a dielectric material 601 is deposited on the wafer (step 2). The dielectric material 601 can be deposited by spin on methods, chemical vapor deposition, or physical vapor deposition. The preferred method is spin on deposition of glass ($SiO_2$), also known as spin on glass, or SOG. Other dielectric films may be used, such boron-doped $SiO_2$ (BSG), phosphorus doped $SiO_2$ (PSG), boron and phosphorus doped $SiO_2$ (BPSG), low k dielectrics like Si—C—O—H, high k films like $Al_2O_3$ of $HfO_2$, and other suitable dielectrics. In one preferred embodiment, the nanowires are about 2.5µm tall, the dielectric is about 1000 to about 6000 Å thick, most preferably about 3000Å as measured on the planar surface at the bottom. Next, a mask of photoresist (not illustrated) is applied to the pad areas, and the dielectric material 601 is removed in unmasked areas 602 by wet or dry etch (step 3). Wet etch by dilute hydroflouric acid (HF) is preferred to avoid plasma damage. A transparent conductive oxide (TCO) film 13 such as indium tin oxide (ITO) is deposited next (step 4). Other TCO films such as aluminum doped zinc oxide can also be used. The film can be deposited by physical methods such as evaporation or sputtering, by CVD, or by a combination of methods. It is most preferably deposited by a sputtering method that preferably does not damage the pGaN. The ITO film can be about 100Å to about 10,000Å thick, most preferably about 8,000 Å.

In the next step (step 5), standard lithography is used to mask the mesa pattern with photoresist, and films are removed in the future n contact area 9 and around the mesa edge to define and isolate the device. Then a dielectric material 603 (e.g., SOG) is deposited to passivate the sidewalls of the device and any exposed partially etched nanowires 1. Standard photolithography is used to deposit a mask (e.g., resist) that covers all features except for the n and p contact areas 9, 10. These exposed n and p contact areas 9, 10 are wet or dry etched to remove dielectric 603 from them, exposing the nGaN buffer layer 7 and ITO 13, respectively (step 6). A metal contact stack consisting of Al, Ti, and Au is then deposited by evaporation. The photoresist mask with metal is then lifted off the wafer, leaving the N-metal and P-metal contacts 17A, 17B (step 7).

Figure 7:
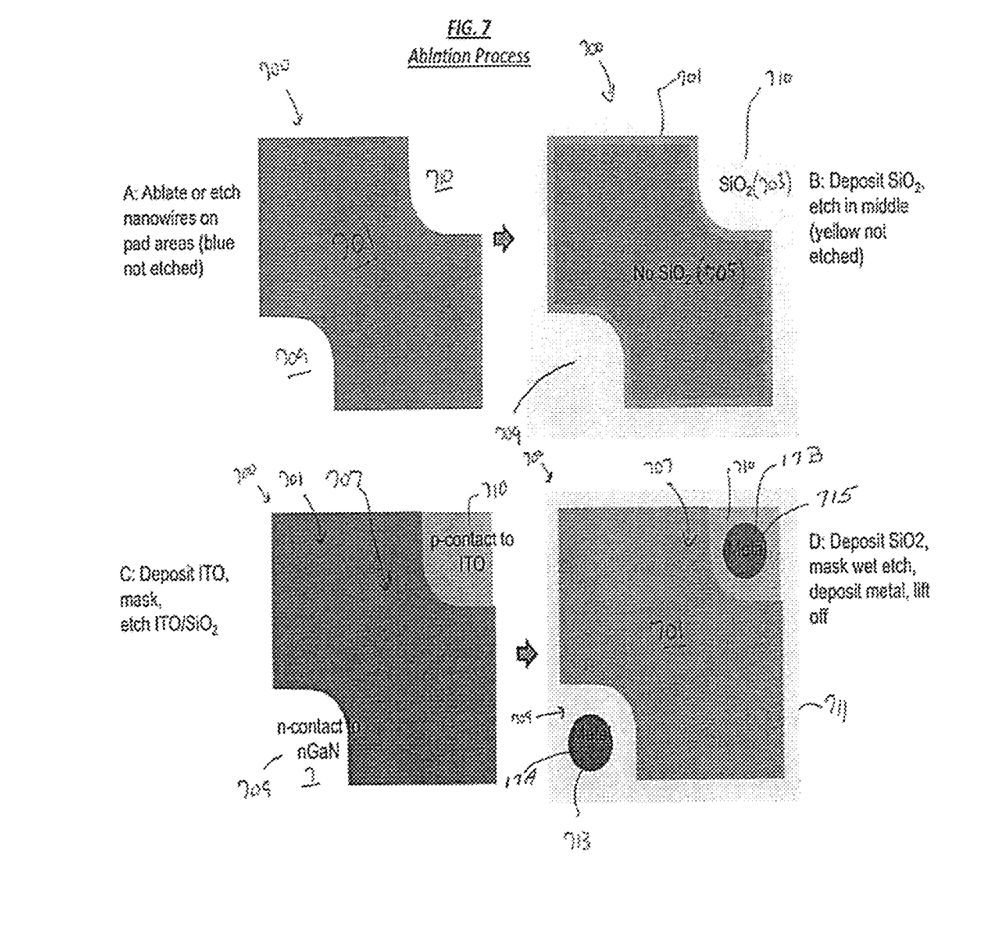
FIGS. 7A-D schematically illustrate overhead views of a method of fabricating contact electrodes for a nanowire LED according to one embodiment of the invention.

FIGS. 7A-D are overhead views illustrating process steps for forming a nanowire LED device 700 according to one embodiment. In FIG. 7A, nanowires are removed from pad areas 709, 710 via ablation or etching, while the nanowires in region 701 are not ablated or etched. A dielectric material 703 (e.g., $SiO_2$) is deposited over the device, including regions 701, 709 and 710. Standard lithography may be used to mask regions 709 and 710 and a peripheral portion of the nanowires 701. An unmasked region 705 may be etched to remove the dielectric material 703 and expose the nanowires in region 705, as shown FIG. 7B. A transparent conductive oxide (TCO) material 707, such as indium tin oxide (ITO), is deposited over the device, including regions 701, 709 and 710. Standard lithography may be used to mask regions 701 and 710. Unmasked region 709 may be etched to remove the TCO material 707 and the dielectric material 703 in region 709 and expose the underlying nGaN layer 7, as shown in FIG. 7C. An additional dielectric material 711 may be deposited over the device, including over the TCO layer 707 and nanowires in region 701, over the TCO layer 707 and dielectric layer 703 in region 710, and over the exposed nGaN layer 7 in region 709. Standard lithography may be used to mask the entire device 700 with the exception of n-metal contact area 713 in region 709 and p-metal contact area 715 in region 710. The unmasked metal contact areas 713, 715 may be etched (e.g., wet etched) through the mask to remove the additional dielectric layer 711 in n-metal contact area 713 and expose the nGaN layer 7, and to remove the additional dielectric layer 711 in p-metal contact area 715 and expose the TCO layer 707. A metal contact material (e.g., metal contact stack including Al, Ti, and Au) may be deposited over the photoresist mask (not shown) and the metal contact areas 713, 715. The photoresist mask with metal may then be lifted off the device 700, leaving the N-metal and P-metal contacts 17A, 17B in metal contact areas 713, 715, as shown in FIG. 7D.

A nanowire LED is intended to either emit light from the top of the nanowire or from the bottom of the nanowire, or both. In the case of a bottom emitting nanowire LED, the top contact material can be a reflecting layer like silver or aluminum, but for a top emitting nanowire LED, as described in the above example, the top contact material needs to be transparent. Silver, among the metals, has the best reflection coefficient in the visible region of the optical spectra, but is more prone to exhibit corrosion damage in normal atmosphere if not capped inside a structure. $Si_3N_4$, $SiO_2$, $Al_2O_3$ or any other stable dielectric can be used as a capping layer. Aluminum has a reflective index in the visible region somewhat lower than silver, but exhibits very good corrosion resistance in dry atmospheric environments. In order to improve device reliability additional dielectric capping as described above may still be desired. In the case of a transparent top contact layer, Indium Tin Oxide (ITO), as described, or other transparent compounds or highly doped semiconductors having high electrical conductivity and transmittance may be used. This includes the use of very thin metals, such as 50Å of Ni, which, despite being a metal which is generally highly absorbing, is mostly transparent due its thinness.

Although the present invention is described in terms of contacting of nanowire LEDs, it should be appreciated that other nanowire based semiconductor devices, such as field-effect transistors, diodes and, in particular, devices involving light absorption or light generation, such as, photodetectors, solar cells, lasers, etc., can be contacted in the same way, and in particular the laser ablation method can be implemented on any suitable nanowire structures or can be used on planar devices.

The invention also provides LED structures.

In certain embodiments, the invention provides a LED structure comprising a plurality of nanowires arrayed on a support that comprises a substrate layer, a buffer layer, and a dielectric masking layer, where the structure comprises (i) a first electrode region comprising the substrate and the buffer layer that is uncovered by the nanowires, wherein the buffer layer serves as a first electrode layer, and (ii) a second electrode region comprising (a) a central area that is uncovered by the nanowires comprising the substrate, an insulating layer, and a second electrode layer on the insulating layer, (b) a peripheral area comprising the substrate, the buffer layer, the mask layer, and a plurality of nanowires comprising a first conductivity type semiconductor nanowire core that is in electrical contact with the buffer layer and an enclosing second conductivity type semiconductor shell, wherein the core and the shell are configured to form a pn or pin junction that in operation provides an active region for light generation and the shell is insulated from the buffer layer by the masking layer, an insulating layer on at least some of the nanowires, the insulating layer is contiguous with the insulating layer of the central area, and the second electrode layer contiguous with the electrode layer of the central area and contacting the nanowire shells.

The LED structure may further comprise a conductive contact pad in electrical contact with the electrode layer of the central area of the first region, such as a metallic pad, e.g., a metallic pad comprising Al.

The LED structure may further comprise a metallic contact pad in electrical contact with the buffer layer of the second region, e.g., a metallic pad, e.g., a metallic pad comprising Al.

In certain embodiments of the LED structure, the first conductivity type comprises n-type, the second conductivity type comprises p-type and the electrode layer comprises a p-electrode layer.

In certain embodiments, the support layer is reflective, such as a support layer comprising a reflective layer, e.g., a Ag bottom layer to provide reflectivity. Other suitable reflective materials, as described herein, may be used. In other embodiments, the support layer is transparent.

In certain embodiments, the invention provides a light emitting diode (LED) structure comprising (i) a plurality of devices on a support layer that comprises a substrate, a buffer layer, and a dielectric mask layer, wherein the devices comprise a first conductivity type semiconductor nanowire core that is in electrical contact with the buffer layer and an enclosing second conductivity type semiconductor shell, wherein the core and the shell are configured to form a pn or pin junction that in operation provides an active region for light generation and the shell is insulated from the buffer layer by the mask layer, and (ii) a first electrode for contacting the first conductivity type core and (iii) a second electrode for contacting the second conductivity type shell, wherein the first electrode and/or at least a portion of the second electrode are flat. The term "flat" as used herein is intended to indicate a profile that is obtained such that it is different than a profile obtained by etching. As described herein, laser ablation, in one embodiment, allows for a better means to provide for contacts. Also, flat includes surfaces at least <200 nm peak to valley in a 1 µm×1 µm area. Flat surfaces of the inventions described herein can also include about 50 nm peak to valley in a 1 µm×1 µm area, about 200 nm peak to valley in a 1 µm×1 µm area, and 500 nm peak to valley in a 1 µm×1 µm area.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

What is claimed is:

1. A LED structure comprising a plurality of nanowires arrayed on a support that comprises a substrate layer, a buffer layer, and a dielectric masking layer, wherein the structure comprises:
   (i) a first electrode region comprising the substrate and the buffer layer that is uncovered by the nanowires, wherein the buffer layer serves as a first electrode layer, and
   (ii) a second electrode region comprising
      (a) a central area that is uncovered by the nanowires comprising the substrate, an insulating layer on the substrate, and a second electrode layer on the insulating layer, and
      (b) a peripheral area comprising the substrate, the buffer layer, the masking layer, a plurality of nanowires comprising a first conductivity type semiconductor nanowire core that is in electrical contact with the buffer layer and an enclosing second conductivity type semiconductor shell, wherein the core and the shell are configured to form a pn or pin junction that in operation provides an active region for light generation and the shell is insulated from the buffer layer by the masking layer, an insulating layer on at least some of the nanowires, the insulating layer is contiguous with the insulating layer of the central area, and the second electrode layer is contiguous with the electrode layer of the central area, and contacting the nanowire shells.

2. The LED structure of claim 1 further comprising a conductive contact pad in electrical contact with the second electrode layer of the central area.

3. The LED structure of claim 2 wherein the conductive contact pad is a metallic pad.

4. The LED structure of claim 3 wherein the conductive contact pad comprises Al.

5. The LED structure of claim 1 further comprising a conductive contact pad in electrical contact with the buffer layer in the first electrode region.

6. The LED structure of claim 5 wherein the conductive contact pad is a metallic pad and the first electrode region surrounds the second electrode region.

7. The LED structure of claim 6 wherein the conductive contact pad comprises Al.

8. The LED structure of claim 1, wherein the first conductivity type comprises n-type, the second conductivity type comprises p-type and the second electrode layer comprises a p-electrode layer.

9. The LED structure of claim 1, wherein the support layer is reflective.

10. The LED structure of claim 9 wherein the support layer comprises a Ag bottom layer to provide the reflectivity.

11. The LED structure of claim 1, wherein the support layer is transparent.

* * * * *